United States Patent
Webb et al.

(10) Patent No.: US 6,560,039 B1
(45) Date of Patent: May 6, 2003

(54) DOUBLE MIRROR CATADIOPTRIC OBJECTIVE LENS SYSTEM WITH THREE OPTICAL SURFACE MULTIFUNCTION COMPONENT

(75) Inventors: James E. Webb, Fairport, NY (US); C. Theodore Tienvieri, Rochester, NY (US)

(73) Assignee: Tropel Corporation, Fairport, NY (US)

( * ) Notice: Subject to any disclaimer, the term of this patent is extended or adjusted under 35 U.S.C. 154(b) by 0 days.

(21) Appl. No.: 09/670,069

(22) Filed: Sep. 26, 2000

Related U.S. Application Data
(60) Provisional application No. 60/156,501, filed on Sep. 28, 1999.

(51) Int. Cl.$^7$ ............................................. G02B 17/00
(52) U.S. Cl. ....................... 359/731; 359/365; 359/727; 359/729
(58) Field of Search ................... 359/364, 365, 359/366, 726, 727, 728, 729, 730, 731, 732, 387, 389

(56) References Cited

U.S. PATENT DOCUMENTS

| | | | |
|---|---|---|---|
| 2,492,461 A | 12/1949 | Bouwers | 88/57 |
| 2,520,633 A | 8/1950 | Grey | 88/57 |
| 2,520,635 A * | 8/1950 | Grey | 359/731 |
| 2,520,636 A | 8/1950 | Grey | 88/57 |
| 2,576,011 A | 11/1951 | Grey | 88/57 |
| 2,664,026 A | 12/1953 | Kavanagh | 88/57 |
| 2,684,015 A | 7/1954 | Grey | 88/57 |
| 2,730,013 A | 1/1956 | Mandler | 88/57 |
| 2,748,658 A | 6/1956 | Bouwers | 88/57 |
| 2,916,966 A | 12/1959 | Nomarski et al. | 88/57 |
| 3,001,446 A | 9/1961 | Bouwers et al. | 88/57 |
| 3,926,505 A * | 12/1975 | Rayces | 359/731 |
| 4,547,045 A | 10/1985 | Canzek | 350/444 |
| 4,835,380 A | 5/1989 | Opheij et al. | 250/216 |
| 5,031,976 A | 7/1991 | Shafer | 350/1.2 |
| 5,155,554 A | 10/1992 | Schnable et al. | 356/359 |
| 5,159,495 A | 10/1992 | Hamblen | 359/731 |
| 5,650,877 A | 7/1997 | Phillips, Jr. et al. | 359/732 |
| 5,717,518 A | 2/1998 | Shafer et al. | 359/357 |
| 5,757,493 A | 5/1998 | VanKerkhove | 356/359 |
| 5,771,125 A | 6/1998 | Ishiyama | 359/727 |

FOREIGN PATENT DOCUMENTS

| | | |
|---|---|---|
| JP | 92809 | 4/1991 |
| NE | 75324 | 7/1954 |

OTHER PUBLICATIONS

"Performance of small field 193 nm exposure system", D.H. Kim, K.H. Lee, J.S. Choi, H. Oh, H.B. Chung and H.J. Yoo, SPIE, vol. 3051/923, p. 922–932, Sep. 1959.*

(List continued on next page.)

*Primary Examiner*—Thong Nguyen
*Assistant Examiner*—Jesse Rowe
(74) *Attorney, Agent, or Firm*—Eugene Stephens & Associates

(57) ABSTRACT

A double mirror objective lens system uses a three optical surface refractor incorporating a convex mirror into a right surface thereof that reflects incident light to a concave mirror, which reflects the light back through the refractor and on toward a focal point of the system. This arrangement yields better resolution images with low spherical aberration, minimal chromatic aberration, and long working distance. A variation of the invention includes another refractor, a right surface of which carries the concave mirror to form a Mangin mirror. This variation on of the invention has even less aberration over increased wavelength range due to better corrected chromatic aberration.

11 Claims, 11 Drawing Sheets

OTHER PUBLICATIONS

"A New Series of Microscope Objectives: I. Catadioptric Newtonian Systems", D. S. Grey and P.H. Lee, Journal of the Optical Society of America, vol. 39, No. 9, p. 719–423, Sep. 1949.

A New Series of Microscope Objectives: II. Preliminary Investigation of Catadioptric Schwarzchild Systems, D.S. Grey, Journal of the Optical Society of America, vol. 39, No. 9, p. 723–728, Sep. 1949.

A New Series of Microscope Objectives: III. UV Objectives of Intermediate Numerical Aperture, D.S. Grey, Journal of the Optical Society of America, vol. 40, No. 5, p. 283–290, May 1950.

"Computed Abberations of Spherical Schwarzschild Reflecting Microscope Objectives", D.S. Grey, Journal of the Optical Society of America, vol. 41, No. 3, p. 183–192, Mar. 1951.

"Mirror Anastigmat with Two Concentric Spherical Surfaces", P. Erdos, Journal of the Optical Society of America, vol. 49, No. 9, p. 877–886, Sep. 1959.

* cited by examiner

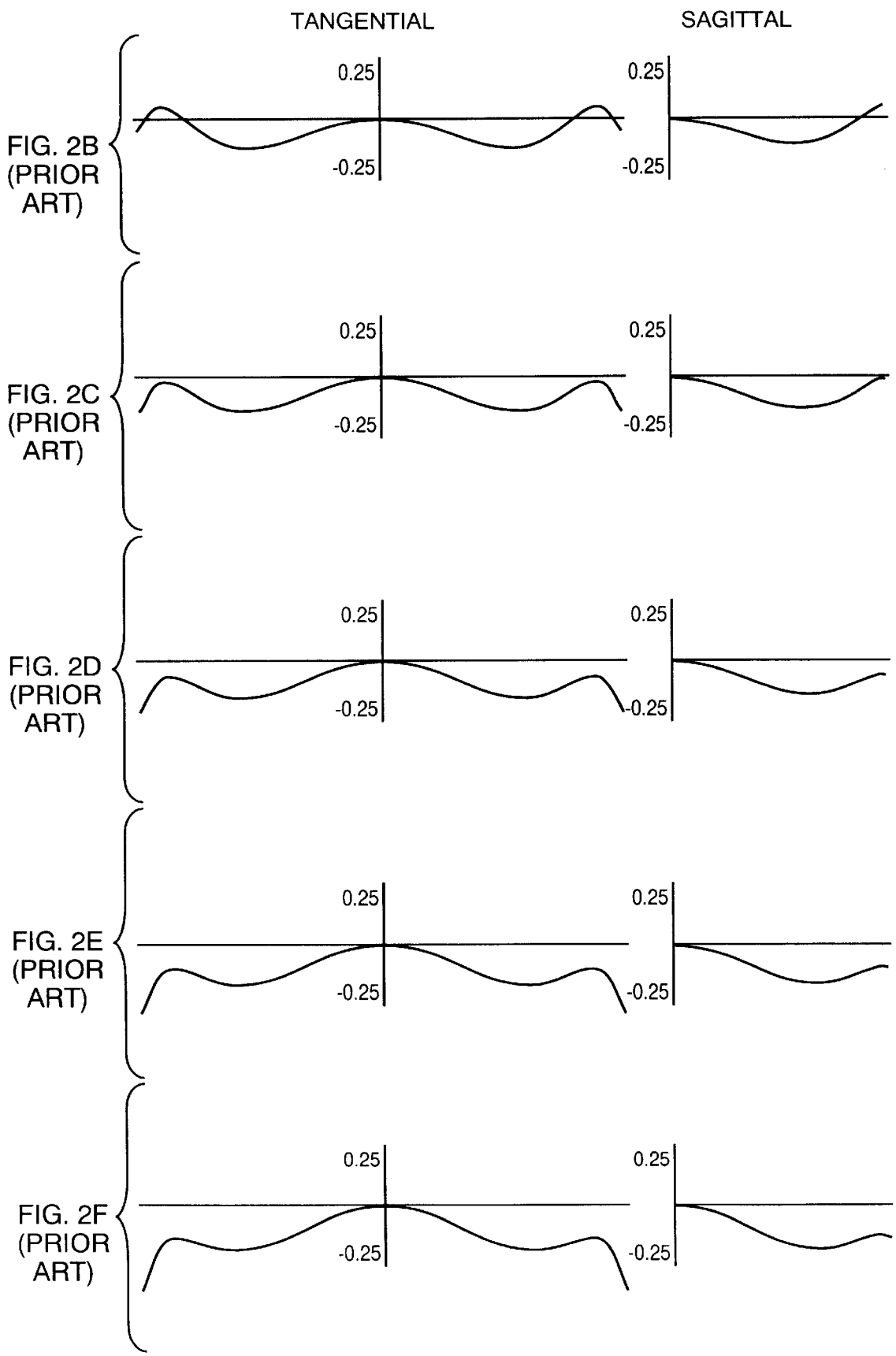

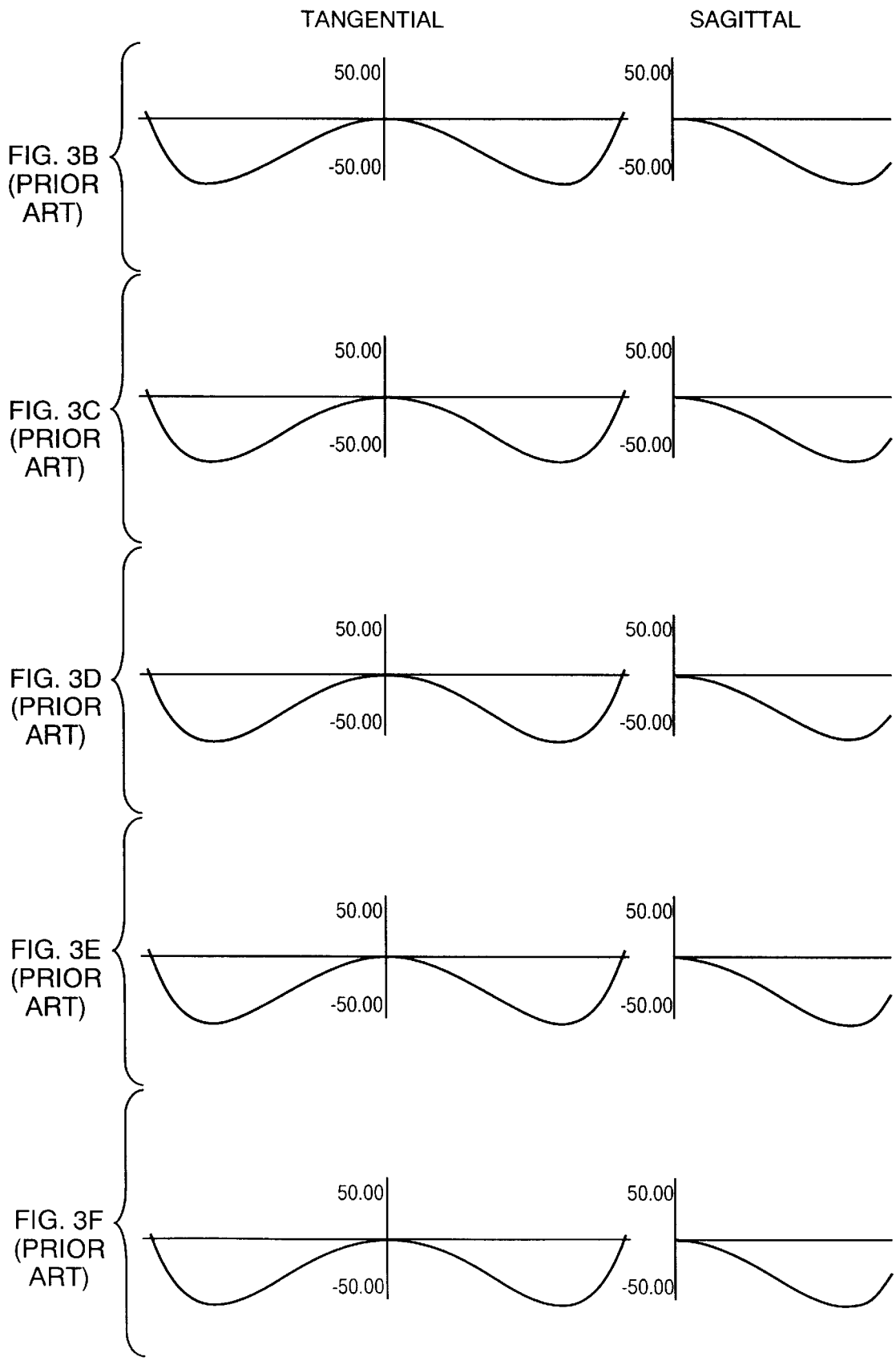

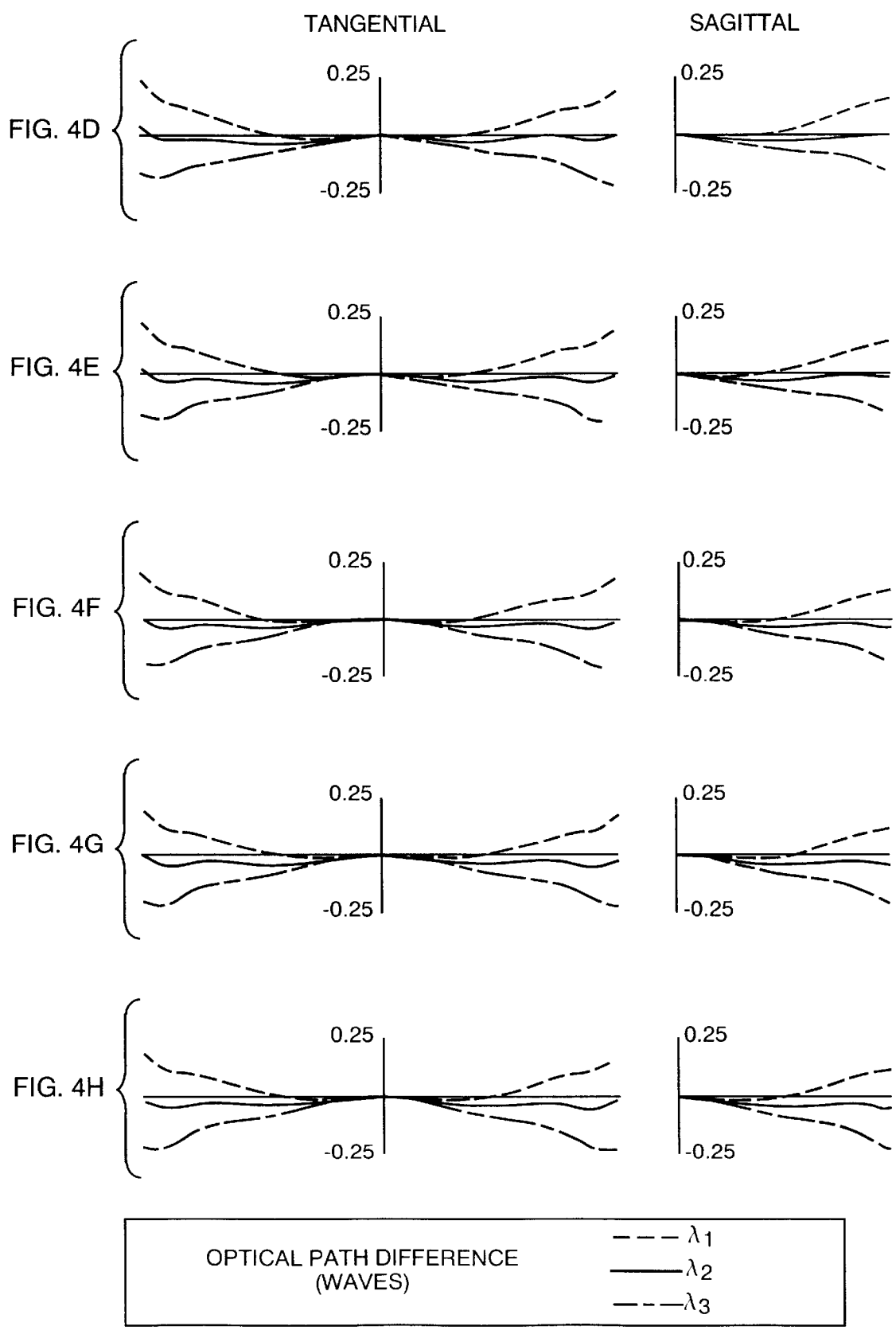

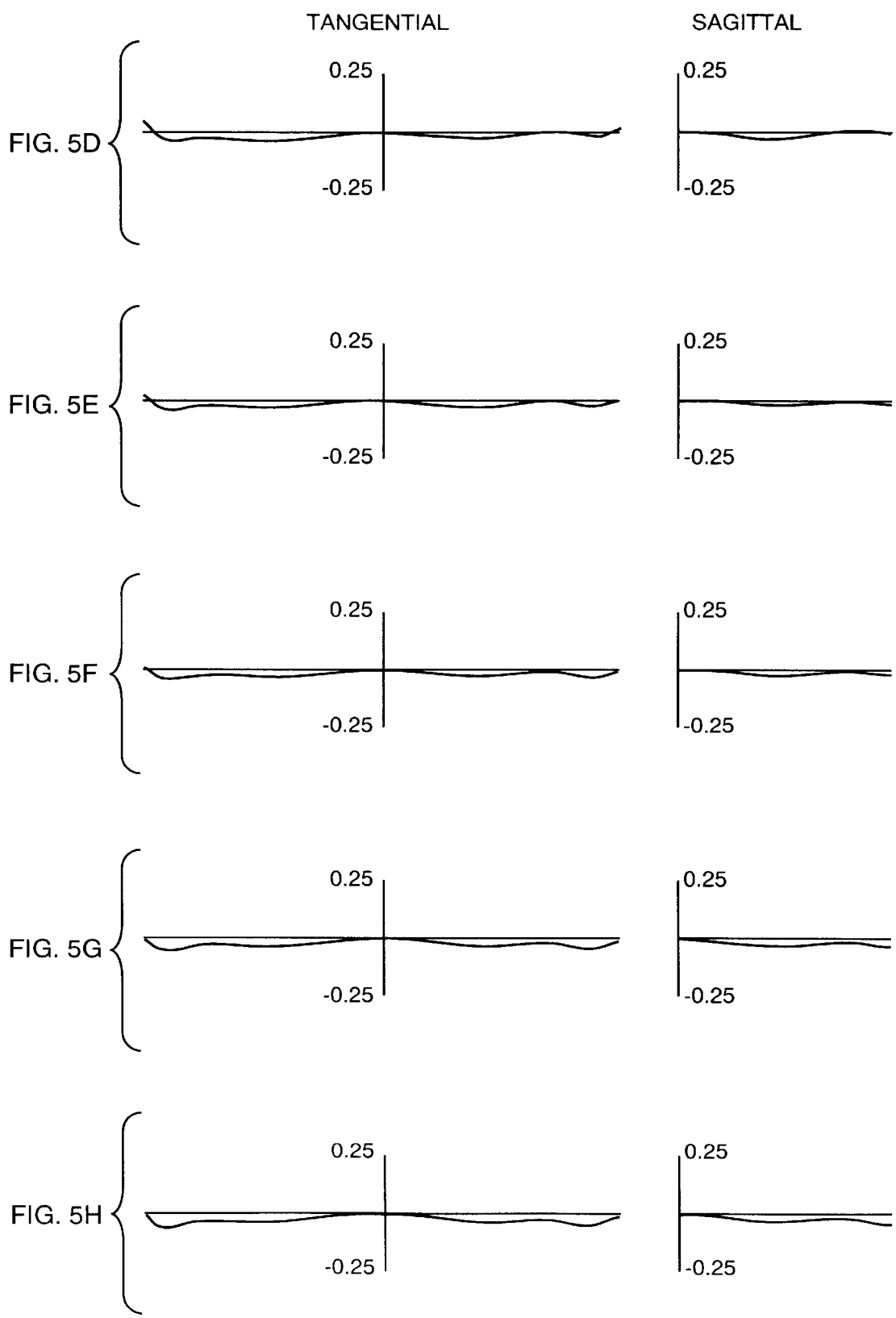

US 6,560,039 B1

DOUBLE MIRROR CATADIOPTRIC OBJECTIVE LENS SYSTEM WITH THREE OPTICAL SURFACE MULTIFUNCTION COMPONENT

RELATED PATENTS

This application claims benefit of the filing date of Provisional U.S. Patent Application No. 60/156,501, filed Sep. 28, 1999, and hereby incorporates the disclosure thereof by reference.

TECHNICAL FIELD

The invention relates to objective lenses used in a variety of applications, including microlithography, photo-ablabon, ultraviolet (UV) inspection, and mastering of optical data storage media, such as CD and DVD.

BACKGROUND OF THE INVENTION

Prior art objective lenses suffer from problems that render them inferior for our purposes. One type of prior art objective lens suitable for many applications is the double mirror objective lens, examples of which are shown in FIGS. 1A, 2A, and 3A, which are shown approximately to scale relative to one another. While relatively easy and inexpensive to manufacture, and while enjoying little, if any, chromatic aberration, double mirror objectives using two spherical mirrors must generally adhere to the Schwarzschild ratio, a ratio of the radii of curvature of the lenses equal to a value of about 2.6, to reduce aberrations. Adherence to the Schwarzschild ratio limits the amount by which obscuration can be reduced without undesirably increasing aberrations. In the example shown in FIG. 1A, the double mirror objective 1 includes a light path 2 along which light travels to strike a convex mirror 3, which reflects the light onto a concave mirror 4. In the objective lens of FIG. 1A, the light path 2 includes a hole in the concave mirror 4, but the light can be transmitted to the convex mirror 3 in other ways. The concave mirror 4 then reflects the light toward the convex mirror 3 and toward a focal point 5 of the objective 1, which is typically behind the convex mirror 3. This type of double mirror objective forms images with little or no chromatic aberrations, but suffers a large percentage of obscuration by the convex mirror 3 and has a relatively small maximum numerical aperture. When made with a relatively large working distance, the spherical aberrations throughout the image field are unacceptably large as shown in FIGS. 1B–1F. FIG. 2A shows an objective 1' of the type shown in FIG. 1A, but made in relatively compact form to reduce spherical aberrations. While the spherical aberrations of the objective 1' of FIG. 2A are significantly improved as seen in FIGS. 2B–2F, the objective 1' has a much smaller working distance, still has a large obscuration, and still has a relatively small maximum numerical aperture. In FIGS. 2B–2F, traces for three wavelengths, $\lambda_1$, $\lambda_2$, $\lambda_3$, have been included to illustrate the lack of significant chromatic aberrations introduced by this type of objective. In the particular example, $\lambda_1$=248.6 nm, $\lambda_2$=248.4 nm, and $\lambda_3$=248.2 nm.

In applications requiring lower obscurations, the double mirror objective can be forced to have a smaller obscuration as shown in FIG. 3A. Here, the objective 1" includes a convex mirror 3" that is much smaller in relation to the light cone reflected from the concave mirror 4", yielding a much lower obscuration. However, the reduced obscuration comes at the cost of high spherical aberrations, as seen in FIGS. 3B–3F. While these aberrations can be reduced using large departure aspheric mirror surfaces, such large departure surfaces are more difficult and costly to manufacture. As in FIGS. 2B–2F, traces for three wavelengths, $\lambda_1$, $\lambda_2$, $\lambda_3$, have been included in FIGS. 3B–3F to illustrate the lack of significant chromatic aberrations introduced by this type of objective. In the particular example, $\lambda_1$=248.6 nm, $\lambda_2$=248.4 nm, and $\lambda_3$=248.2 nm.

Adding a refractor to the double mirror objective overcomes the problem of spherical aberration in relatively low obscurabon double mirror objectives while avoiding the use of large departure aspheric surfaces. However, introducing such a refractor into the objective yields a catadioptric lens system, which suffers from chromatic aberrations. The chromatic aberrations limit the wavelength range or bandwidth with which a given prior art catadioptric objective can reasonably be used, making such systems impractical for many applications. In addition, prior art catadioptric objectives have problems related to placement of the convex mirror that render the objectives insufficient for our needs.

A particularly good prior art catadioptric objective includes the convex mirror placed in front of a two optical surface refractor. See, for example, U.S. Pat. No. 2,520,635 to Grey. While this arrangement significantly reduces spherical aberration and suffers from a lower chromatic aberration than many other catadioptric objectives, it still suffers from an unacceptably large obscuration. Further, the numerical aperture of this type of objective is still limited in its range. In addition, the convex mirror must be glued or otherwise attached to the refractor, which can cause other problems. In particular, glue can foul the refractor and, in some cases, can break down if exposed to UV rays.

Another good prior art catadioptric objective, an optical disc reader objective disclosed in U.S. Pat. No. 4,835,380 to Opheij et al., uses a concave Mangin mirror with a convex mirror positioned at the center of the Mangin mirror's front surface. This objective enjoys the reduced spherical aberrations of the catadioptric system, but can only be used with a narrow bandwidth of light. Here again, the convex mirror must be glued to or otherwise attached to or supported against the Mangin mirror's front surface. While glues and adhesives work well for the wavelengths used in optical disc readers, many other applications, such as microlithography, use wavelengths that break down most adhesives in short order. In addition, adhesives can alter the light to some degree. Thus, gluing a convex mirror on the front of a Mangin mirror is not a viable solution in applications using wavelengths of light unfriendly to adhesives or that require a minimum of image degradation.

Thus, prior art double mirror objectives can enjoy reduced chromatic and spherical aberration when sized in accordance with the Schwarzschild ratio, but suffer from high obscurations and short working distances. Prior art catadioptric objectives enjoy lower obscurations and low spherical aberrations, but suffer from narrow usable bandwidths because of relatively high chromatic errors. Further, no prior art system has adequately low obscuration, adequately low spherical aberration, and a suitable working distance for many applications, let alone the additional feature of low chromatic aberration. All of these prior art objectives further suffer from relatively low numerical apertures.

SUMMARY OF THE INVENTION

We achieve superior performance in a catadioptric objective by moving the convex mirror to an opposite side of the refractor from the concave mirror, preferably without the use of adhesives or other supports. In the preferred embodiments, we use a multifunction component with a refractor portion and a reflector portion, the reflector portion being the convex mirror and being formed in a surface of the refractor portion. We prefer to grind a depression into a back or right surface of the refractor portion so that the periphery of the reflector portion is surrounded by the back or right refractive interface of the refractor portion. We then polish the depression and coat it with a coating that renders the depression reflective into the refractive material of the refractor portion and toward the concave reflector. In this manner, we produce a multifunction component that retracts, reflects, and again refracts light in one part of a light path through the objective, then refracts the light twice in another part of the light path. For example, in an objective where the light enters the system and crosses the front or left refractive interface of the refractor portion, the light is refracted as it crosses the refractive interface, travels through the refractor portion to reflect from the convex mirror, travels across the front or left refractive interface of the refractor portion where it is again refracted. The light then travels to the concave mirror, where it reflects back toward the multifunction component, at which point the light is refracted twice as it crosses the left and right refractive interfaces of the outer portion of the refractor portion. This preferred embodiment yields an objective with very little spherical aberration over a relatively narrow bandwidth. In a variation of this preferred embodiment, we form the concave mirror as a Mangin mirror and orient the Mangin mirror so that the surface not carrying the reflective coating is an additional refractive interface in the objective. This additional refractive interface corrects chromatic errors, yielding an objective with low spherical and chromatic aberrations that is useful over a relatively wide bandwidth.

A major benefit of the invention is that it can be used with other optics on either end of the objective or even inserted between the concave mirror and the multifunction component. When used with other components in this manner, the concave mirror and multifunction component can greatly reduce spherical and chromatic errors for particular applications, such as those discussed above. Thus, the invenbon can be applied in a great many ways and with a great many variations.

In a variation of the exemplary embodiment, we form the concave mirror as a Mangin mirror, effectively creating a second multifunction component. The left surface of the Mangin mirror preferably carries the reflective coating so that the right surface of the Mangin mirror is an additional refractive interface. This additional refractive interface corrects chromatic errors introduced by the concave mirror, then reflects from the concave mirror to the refractor so that the light refracts through the first and second surfaces of the refractor as it travels to a second end of the system. Such an arrangement yields an objective that suffers from little spherical aberration, enjoys low obscuration, has a higher numerical aperture, and has a relatively large working distance, overcoming most of the deficiencies of prior art objectives.

We have also found that forming the concave mirror as a Mangin mirror not only further reduces the spherical aberration caused by the concave mirror, but also dramatically reduces the chromatic aberration of the system. Thus, this form of our inventive catadioptric objective overcomes even more of the deficiencies of the prior art and is suitable for a wide variety of applications.

In our preferred embodiment, we grind and polish a depression in the right surface of the refractor, coating the depression with a reflective coating, if necessary, to form the convex mirror. This overcomes the problems in the prior art associated with supporting the convex mirror, reduces obscuration by moving the convex mirror back, and allows greater correction for spherical aberration since light incident on the convex mirror is refracted on its way to the mirror and on its way out of the refractor.

DESCRIPTION OF THE DRAWINGS

FIGS. 2B–2F illustrate the tangential and sagittal optical path difference through the objective of FIG. 1A at various points in the image field for three particular wavelengths.

FIGS. 3B–3F show the tangential and sagittal optical path difference through the objective of FIG. 1A at various points in the image field for three particular wavelengths.

FIGS. 4D–4H illustrate the tangential and sagittal optical path difference through the objective of FIG. 4A at various points in the image field for three particular wavelengths.

FIGS. 5D–5H illustrate the tangential and sagittal optical path difference through the objective of FIG. 5A at various points in the image field for three particular wavelengths.

DESCRIPTION OF THE INVENTION

In this description, and in FIGS. 4A–5H, we provide an exemplary embodiment of the invention in its simplest form, with some variation, as an infinite conjugate objective with a numerical aperture of about 0.6, a wavelength range or bandwidth of from about 248.2 nm to 248.6 nm, silicon dioxide on the refractive surfaces, and, unless otherwise noted, 10% obscuration. However, these examples do not limit the invention in any way. The inventive objective could also be a finite conjugate objective, and other applications, wavelength ranges, numerical apertures, materials, and obscurations can be used as desired and as appropriate without departing from the spirit of the invention. Further, additional components can be added to the system without departing from the spirit of the invention so long as the multifunction component is present and receives and corrects light passing through the system. For example, additional components could be interposed between the concave reflector and the main refractor, after the main refractor, and/or before the concave reflector. Thus, our invention can comprise a core of more complex optical systems. The illustrative schematic of FIG. 6 provides an example of an apparatus in which additional components are used with the invention. Also, for simplicity we describe the light passing through the objective as traveling in one direction. Those skilled in the art will realize that the light can travel either way in the invention, even at the same time, as indicated by the double arrowheads on the traced rays in the FIGS.

Figure 1A:
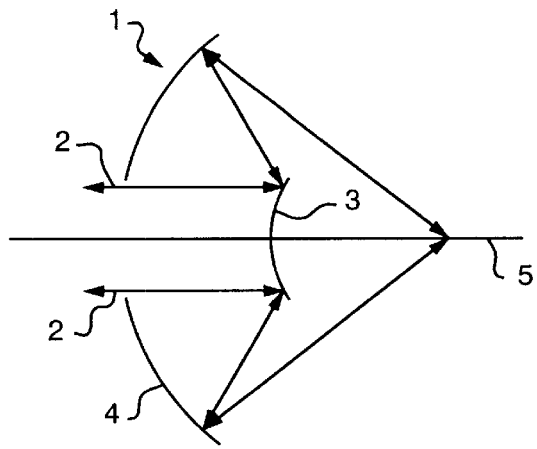
FIG. 1A is a schematic representation of a prior art double spherical mirror objective lens system in cross-section with a relatively high working distance, but high obscuration and spherical aberration.
Figure 2A:
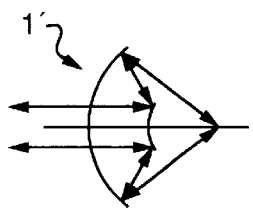
FIG. 2A is a schematic representation of a prior art double spherical mirror objective lens system in cross-section with the same obscuration as that shown in FIG. 1 with improved spherical aberration, but with relatively short working distance.
Figure 3A:
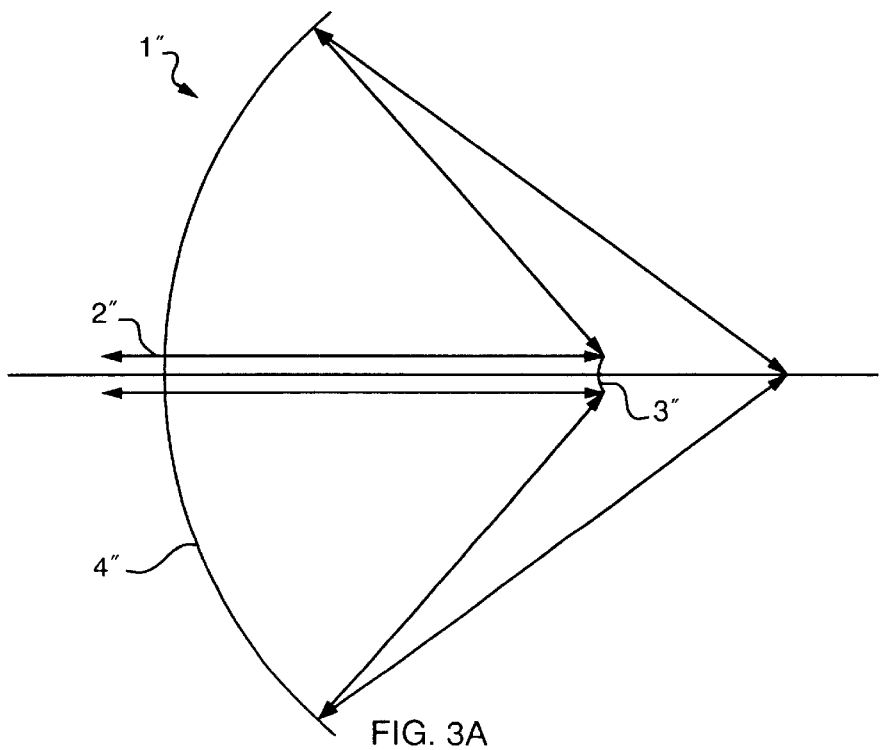
FIG. 3A is a schematic representation of a prior art double spherical mirror objective lens system in cross-section with low obscuration and relatively large working distance, but with high spherical aberration.
Figures 1B, 1C, 1D, 1E, 1F:
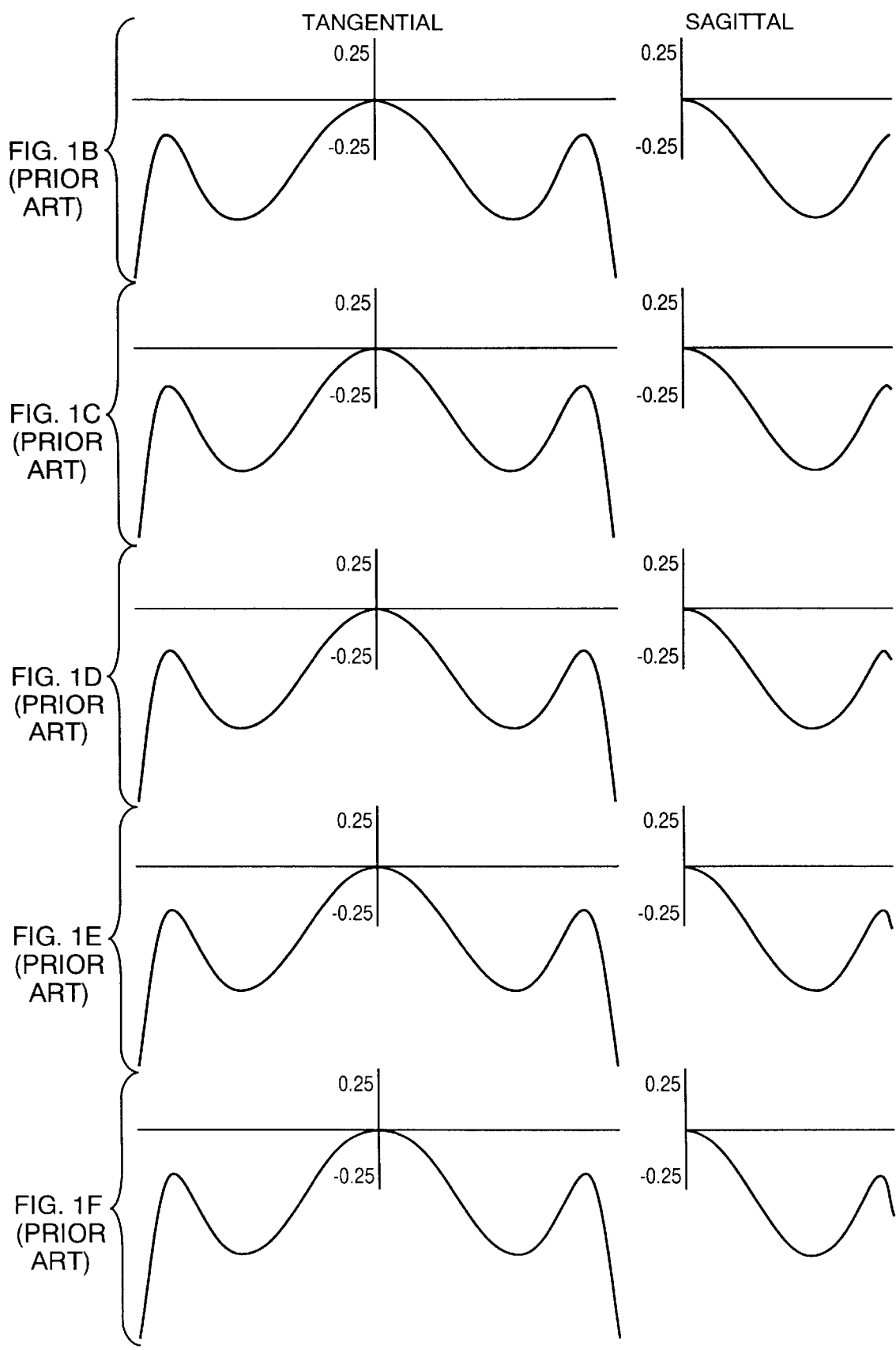
FIGS. 1B–1F illustrate the tangential and sagittal optical path difference through the objective of FIG. 1A at various points in the image field at a particular wavelength.
Figure 4A:
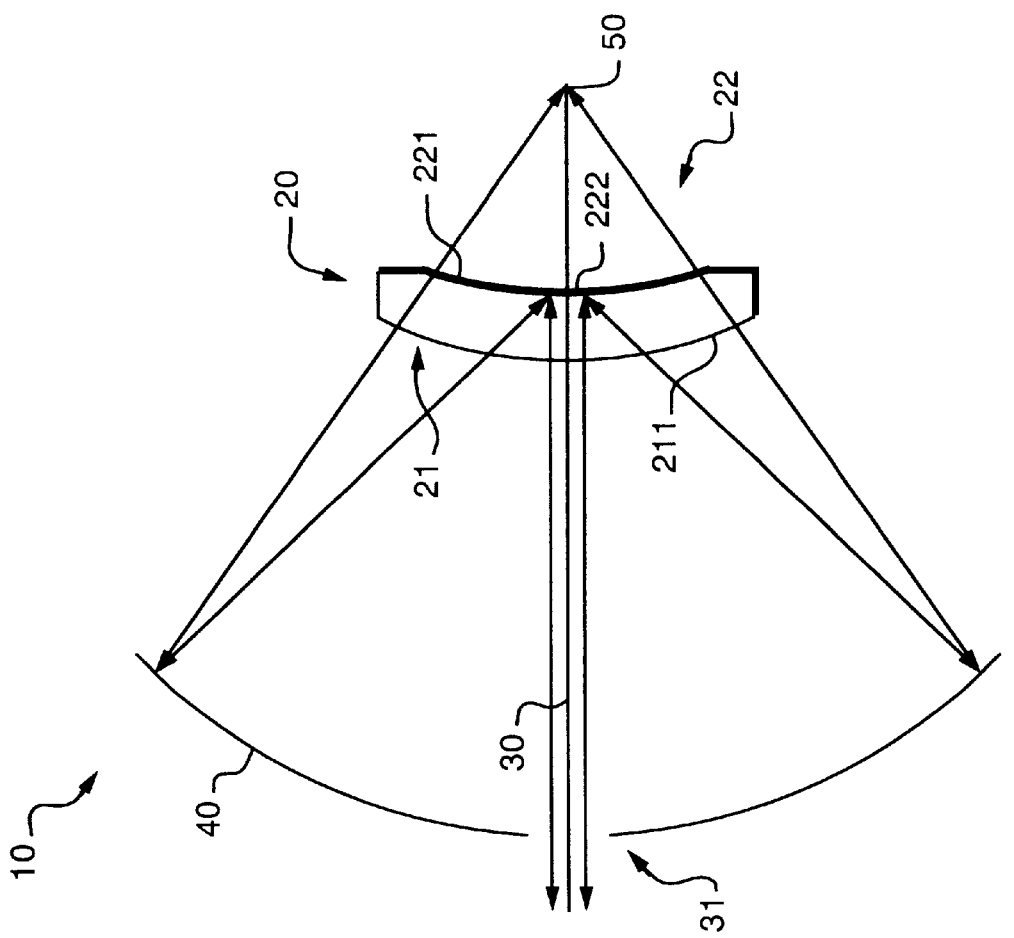
FIG. 4A is a schematic representation of an objective lens system according to the invention in cross-section.
Figure 4B:
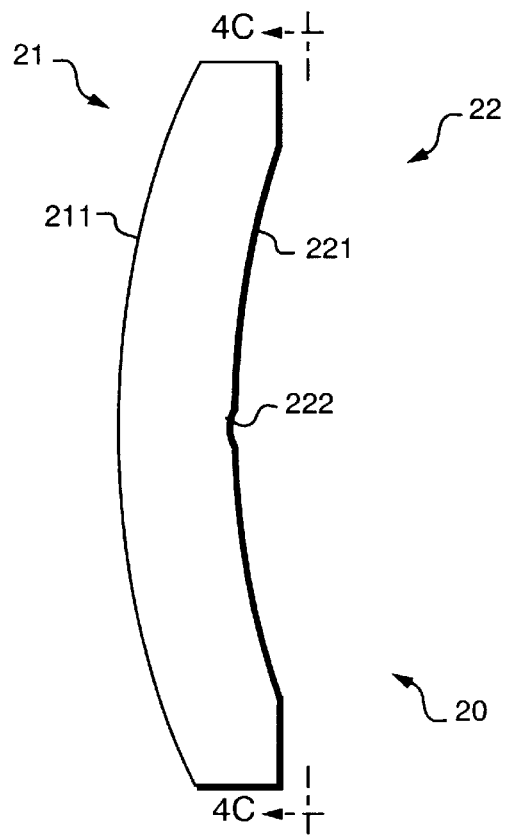
FIG. 4B is a cross sectional close-up schematic representation of the refractor of the invention of FIG. 4A.
Figure 4C:
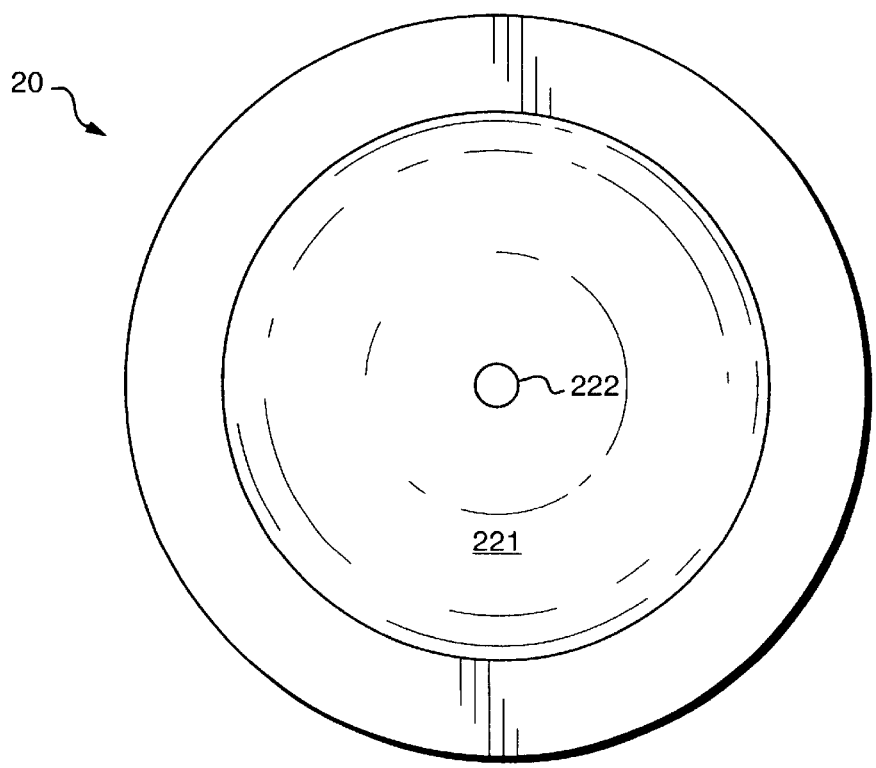
FIG. 4C is a view of the invention as shown in FIGS. 4A and 4B taken along line 4C–4C in FIG. 4B.

With particular reference to FIGS. 4A–4C, our inventive objective lens system 10 includes a multifunction component 20 with three or more optical surfaces 211, 221, 222. A left side 21 of the multifunction component 20 carries a first refractive interface 211, while a right side 22 of the multifunction component 20 carries a second refractive surface 221 and a convex reflective surface 222. As seen in FIG. 4A, a depression in the right side 22 of the multifunction component 20 carries the convex reflective surface 222. We prefer to form the depression by grinding and polishing, but other methods of manufacture capable of producing the depression to required tolerances can be used. A coating applied to the surface of the depression renders the surface reflective, thus forming the convex reflective surface 222.

A light path 30 through the objective 10 allows light to pass through the objective 10 and through the refractor 20, as seen in FIG. 4A. In the exemplary embodiments, the light path 30 includes an opening 31 in a concave reflective surface 40 which allows light to enter or leave the objective 10, depending upon the particular application. The opening 31 can be a through hole bored through the material of the concave reflective surface 40, or can simply be a region of the reflective surface 40 where a coating rendering the reflective surface 40 reflective is thin. enough that light can pass through the region to a desired degree. Of course, the most transmissive coating thickness in the region would be a thickness of zero, and this would be the desired thickness for most applications. If the base material carrying the concave reflective surface 40 does not transmit the desired wavelength of light, then the opening 31 must be formed by boring a hole. In some instances, boring a hole to form the opening 31 would be preferred even if the base material carrying the concave reflective surface 40 can transmit the desired wavelength of light. Other light paths 30 can be used, such as light paths including a beam splitter or prism placed between the multifunction component 20 and the concave reflector 40.

While we generally prefer to use spherical surfaces for the mirrors and refractive surfaces, aspheric surfaces can also be used to further enhance correction of aberrations. In addition, the left and/or right surfaces of the multifunction component can be piano, as seen in the example of the invention shown in FIG. 6. Where the multifunction component 20 has one or both of these surfaces plano, the mirror 222 is still convex and is preferably formed in a depression in the right surface 22 of the multifunction component 20.

The multifunction component 20 is preferably sized and oriented so that light passing through the opening 31 in the concave reflective surface 40 falls on the convex reflective surface 222, which reflects the light toward the concave reflective surface 40. The concave reflective surface 40 reflects the light toward the focal point 50 of the system 10.

On its way to the focal point 50, the light must pass through the multifunction component 20, which corrects for spherical aberrations. Thus, the multifunction component 20 effectively handles light passing through the objective 10 in two stages, taking the place of two or more components: in one stage, the multifunction component 20 refracts, reflects, and refracts; in another stage, the multifunction component 20 refracts, then refracts again.

We have discovered that our multifunction component 20 dramatically reduces spherical aberration in a catadioptric objective 10, as illustrated in FIGS. 4D–4H. As in FIGS. 2B–2F and 3B–3F, traces for three wavelengths, $\lambda_1$, $\lambda_2$, $\lambda_3$, have been included FIGS. 4D–4H to compare the chromatic aberrations introduced by this type of objective. In the particular example, $\lambda_1$=248.6 nm, $\lambda_2$=248.4 nm, and $\lambda_3$=248.2 nm. In the exemplary embodiment, as discussed above, this multifunction component 20 includes a convex mirror 222 of different radius formed on its right surface 22 and, in a simple catadioptric objective, is arranged so that light headed from a left end of the objective 10 passes through the refractor portion to strike the convex mirror, and reflects from the convex mirror back through the refractor portion and on to the concave mirror in the first stage. The refraction across the left refractive interface 211 of the multifunction component 20 as the light travels between the convex and concave mirrors 222, 40 induces increased divergence in the light that significantly increases the aperture. While this introduces chromatic aberrations rendering this simple embodiment useful over a relatively narrow bandwidth, the increase in aperture greatly enhances performance of the objective over that narrow bandwidth. As the light returns through the refractor portion, the refractions across the outer portions of the left and right refractive interfaces 211, 221 adjust spherical aberrations and provide enough degrees of freedom that the spherical aberrations introduced by the concave mirror 40 can be corrected. In comparison to the double mirror objectives of FIGS. 1A–3F, our invention has much lower spherical aberration for a given obscurabon. In addition, we have found that we can achieve numerical apertures as high as 0.85 with this form of our invention without introducing significant spherical aberration.

Figure 5A:
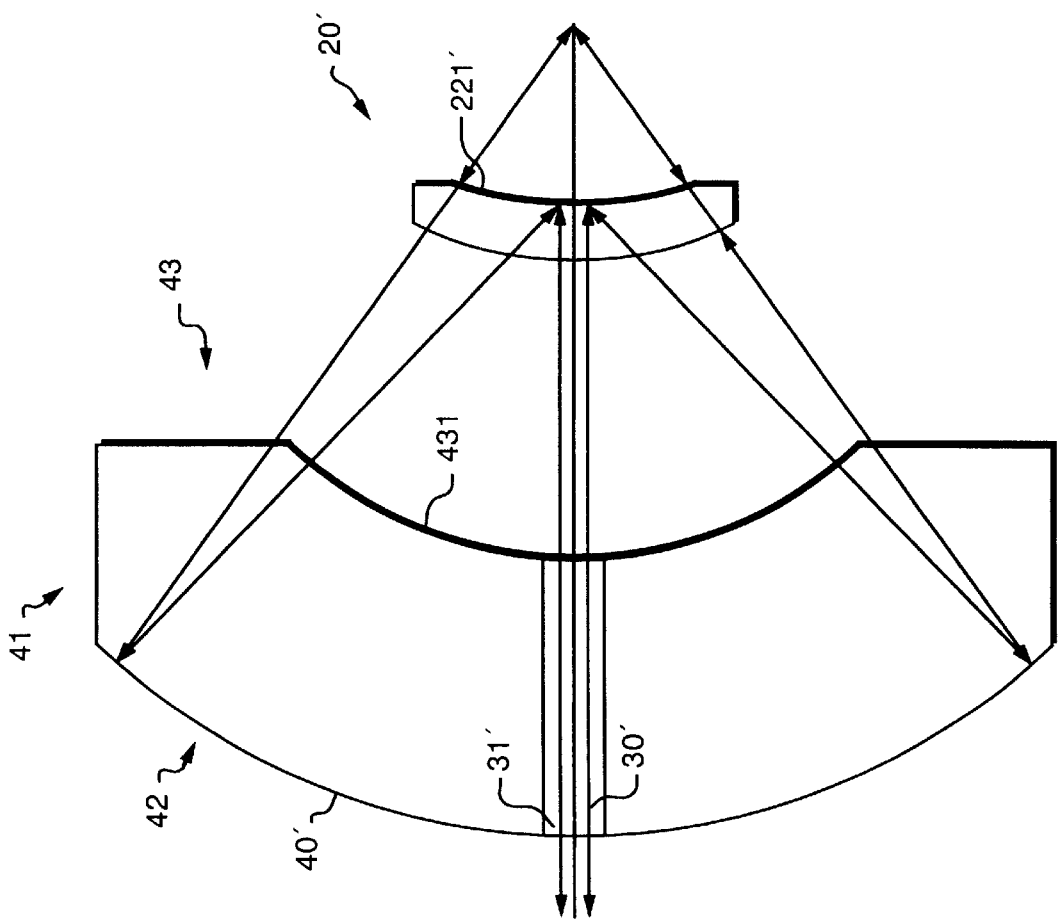
FIG. 5A is a schematic representation of an objective lens system according to the invention in cross-section in which another refractor carries the concave mirror.
Figure 5B:
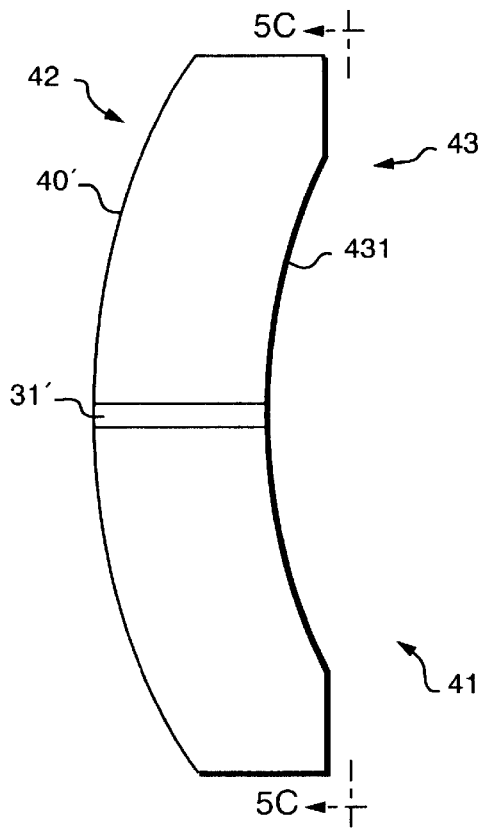
FIG. 5B is a cross sectional close-up schematic representation of the refractor of the invention of FIG. 5A.
Figure 5C:
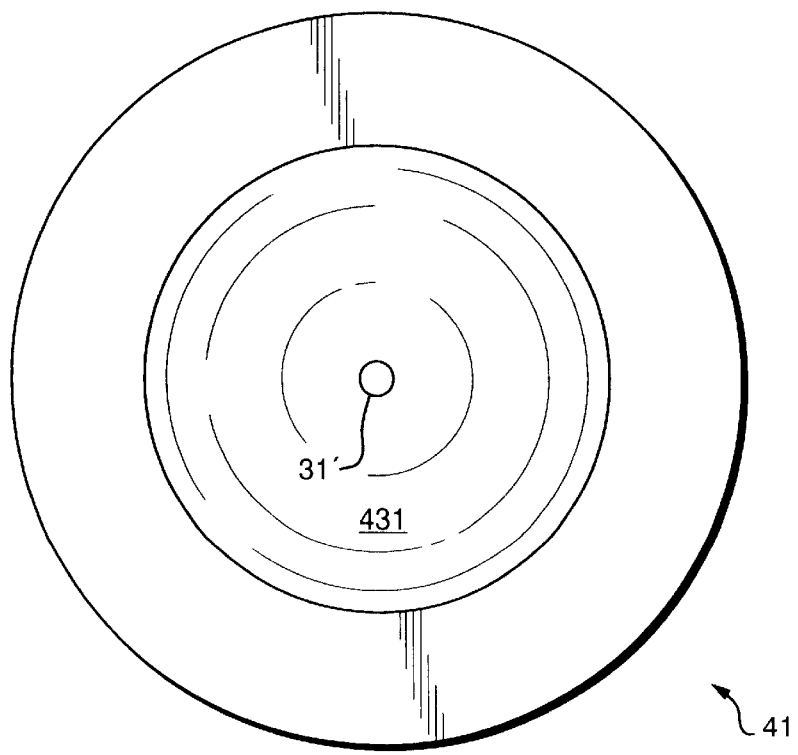
FIG. 5C is a view of the invention as shown in FIGS. 5A and 5B taken along line 5C–5C in FIG. 5B.
Figure 6:
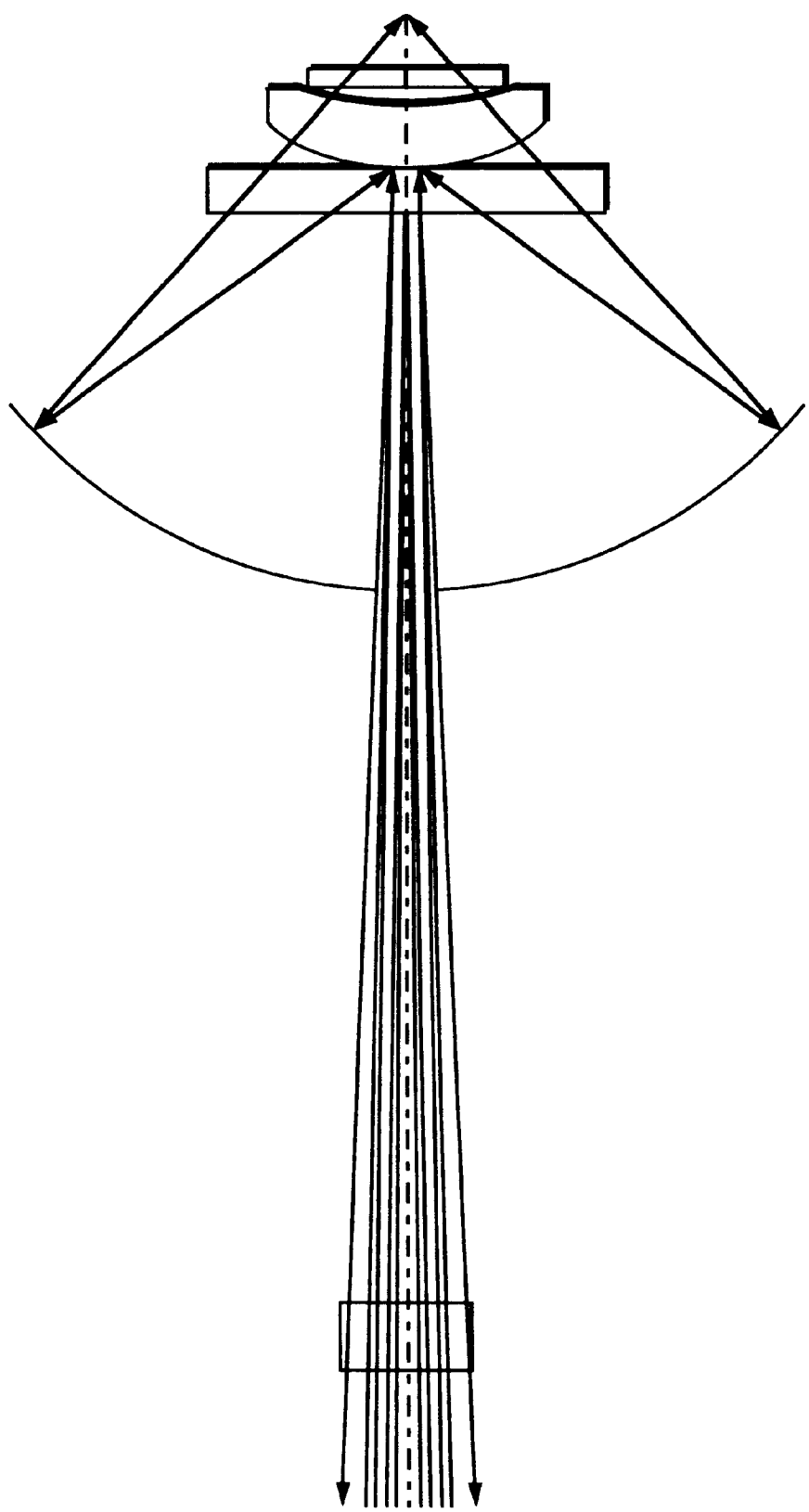
FIG. 6 is an illustrative schematic in cross-section of an apparatus using the invention.

In a variation of our invention, shown in FIGS. 5A–5C, a left side 42 of another multifunction component 41 can carry the concave reflective surface 40'. This allows for dramatically reducing chromatic aberrations, as seen in FIGS. 5D–5H, so that the system is usable with a broader range of wavelengths, depending on the dispersions of the refractors. As in FIGS. 2B–2F, 3B–3F, FIGS. 4D–4H, traces for three wavelengths, $\lambda_1$, $\lambda_2$, $\lambda_3$, have been included FIGS. 5D–5H to compare the chromatic aberrations introduced by this type of objective. In the particular example, $\lambda_1$=248.6 nm, $\lambda_2$=248.4 nm, and $\lambda_3$=248.2 nm. In this variation, a right surface 43 of the additional multifunction component 41 includes a third refractive surface 431, which provides the chromatic aberration correction and some spherical aberration correction. The opening 31', if used, can again be a thinning of the reflective coating applied to the left surface of the additional multifunction component 41, or can be a through hole bored through the entire additional multifunction component 41. Other light paths 30' can be used, such as light paths including a beam splitter or prism placed between the multifunction components 20', 41.

In our preferred implementation of the invention, the reflective surfaces are mirrors or Mangin mirrors, the multifunction component, which we prefer to form as a three optical surface refractor, is made from a solid material, and the space between the concave mirror and the three optical surface refractor is filled with a gas, such as nitrogen. In a more general sense, however, the refracting surfaces are refractive interfaces between the material of the refractor and a material engaging or surrounding the refractor. Thus, the three optical surface refractor could be made from any material so long as it had an index of refraction higher than that of the material immediately between the three optical surface refractor and the concave mirror. Thus, if there were a way to maintain a suitable liquid, for example, in the desired shape, the three optical surface refractor could be made from the liquid. This is true of the refractive material carrying the concave mirror in the variation of the invention shown in FIGS. 5A–5C as well.

Describing our invention in another way, we form the convex mirror 222 by coating a depression in the right side of a special lens 20 with a reflective coating, enabling more correction of light in the system by the lens 20 than that achieved by prior art objectives. The convex mirror 222 is a reflector portion of the lens 20, the remainder of the lens 20 being a refractor portion. The refractor portion has left and right refractive interfaces 211, 221. As light travels along the light path 30, it enters the refractor portion of the lens 20 by crossing the left refractive interface 211 and travels to the reflector portion of the lens 20. The convex mirror 222 reflects the light back into the refractor portion so that it exits the lens 20 by crossing the left refractive interface 211 a second time. This second crossing of the left refractive interface 211 introduces spherical aberration of the opposite sign of that introduced by the concave reflector 40 toward which the light travels from the second crossing of the left refractive interface 211. When the concave reflector 40 reflects the light back toward the lens 20, it introduces its spherical aberration so that the total amount of spherical aberration is relatively small. The outer portion of the refractor portion of the lens 20 then provides additional correction for the spherical aberration remaining in the light as the light crosses the left refractive interface of the lens 20 for a third time and the right refractive interfaces of the lens 20 for the first and last time, yielding the very low amounts of spherical aberration seen in FIGS. 4D–4H and 5D–5H. In the variation of the invention in which the concave reflector 40 is the left surface 42 of a Mangin mirror 41, the refractive material of the Mangin corrects chromatic aberrations in the light.

The light path 30 can also be described as crossing the left refractive interface of the lens 20, passing through the refractor portion of the lens 20 to reflect from the convex reflective surface of the convex mirror 222, passing through the refractor portion of the lens 20 again, crossing the left refractive interface 222 again, traveling to and reflecting from the concave reflective surface of the concave mirror 40, traveling back toward the lens 20, crossing the left refractive interface 222 for a third time, passing through the refractor portion of the lens 20, and exiting the lens 20 through the right refractive interface 221 of the lens 20. The light can also travel in the opposite direction along the path as mention above. Where a Mangin mirror is used for the concave mirror 40', the light path includes crossing the right refractive interface 431 of the Mangin mirror twice: once as the light path enters the Mangin mirror, and once as the light path leaves the Mangin mirror.

FIGS. 6 shows an example of our invention in use with other optics that condition and/or correct the light passing through our inventive objective. This is but one example of many possible applications of our invention that do not depart from the spirit of the invention. In the example shown in FIG. 6, our invention achieves a numerical aperture of 0.8, a field of view of 40 microns, a bandwidth of 120 pm, and a working distance of 5 mm, at wavelengths of 193 or 157.63 nm with a plate thickness of 2 mm and an EPD of 3 mm using $SiO_2$ or $CaF_2$ as the refractive material.

We claim:

1. A catadioptric lens system including:

a concave reflective surface reflecting incident light toward a first material having a first refractive index and toward a focal point of the system;

a convex reflective surface reflecting incident light into a second material having a second refractive index that is higher than the first refractive index;

a first refractive interface at a first boundary of the first and second materials, the first refractive interface lying between the concave and convex reflective surfaces;

a second refractive interface at a second boundary of the first and second materials, the second refractive interface lying between the first refractive interface and a focal point of the objective lens, the convex reflective surface having a periphery connected to the second refractive interface;

a light path aligned with a common axis of the system and allowing light to pass therethrough so that light entering the lens system strikes the convex reflective surface, travels from the convex reflective surface to the concave reflective surface via the first refractive interface, from the concave reflective surface back through the first refractive interface, and through the second refractive interface;

the first and second refractive surfaces being on left and right sides of a multifunction component made from the second material and the convex reflective surface being on a recess in the right side of the multifunction component;

the multifunction component including three radii of curvature including a first radius of curvature of the left side and first refractive interface, a second radius of curvature of the right side and second refractive interface, and a third radius of curvature of the recess and convex reflective surface; and the second and third radii of curvature having different lengths.

2. The system of claim 1 wherein the second radius of curvature is larger than the third radius of curvature to minimize obscuration of the light path caused by the convex reflective surface.

3. The system of claim 2 which the obscuration is 10 percent or less.

4. The system of claim 2 wherein at least a portion of the second refractive interface of the multifunction component is substantially plano.

5. The system of claim 1 wherein the light path includes a hole bored through the concave reflective surface.

6. The system of claim 1 wherein the concave reflective surface includes a coating carried on a surface of a piece of a third material that has a third refractive index that is higher than the first refractive index, the third material is transmissive of a desired wavelength of light, and the light path includes a region about a center of the concave piece of material and upon which a coating thickness allows a desired percentage of the desired wavelength of light to pass through the region.

7. The system of claim 6 wherein the coating thickness in the region is substantially zero so that substantially 100 percent of light incident on the region can pass through the region.

8. A catadioptric lens system including:

a concave reflective surface reflecting incident light toward a first material having a first refractive index and toward a focal point of the system;

a convex reflective surface reflecting incident light into a second material having a second refractive index that is higher than the first refractive index;

a first refractive interface at a first boundary of the first and second materials, the first refractive interface lying between the concave and convex reflective surfaces;

a second refractive interface at a second boundary of the first and second materials, the second refractive interface lying between the first refractive interface and a focal point of the objective lens, the convex reflective surface having a periphery connected to the second refractive interface;

a light path aligned with a common axis of the system and allowing light to pass therethrough so that light entering the lens system strikes the convex reflective surface, travels from the convex reflective surface to the concave reflective surface via the first refractive interface, from the concave reflective surface back through the first refractive interface, and through the second refractive interface; and the concave reflective surface including a coating carried on a surface of a piece of a third material that has a third refractive index that is higher than the first refractive index, the third material being transmissive of a desired wavelength of light, and the light path including a region about a center of the concave piece of material and upon which a coating thickness allows a desired percentage of the desired wavelength of light to pass through the region, wherein a left side of the piece of third material carries the coating so that the piece of third material includes an additional refractor between the concave reflective surface and the first material, a right side of the piece of third material including a third refractive interface between the piece of third material and the first material.

9. The system of claim 8 wherein the desired wavelength of light is in an ultraviolet portion of the electromagnetic spectrum, the first material is a gas, the second material is fused silica, and the third material is calcium fluoride.

10. The system of claim 6 wherein a right side of the piece of third material carries the coating so that the concave reflective surface reflects incident light directly into the first material.

11. The system of claim 1 wherein at least one of the convex and concave reflective surfaces is spherical.

\* \* \* \* \*